(12) United States Patent
Sun

(10) Patent No.: US 9,081,396 B2
(45) Date of Patent: Jul. 14, 2015

(54) LOW POWER AND DYNAMIC VOLTAGE DIVIDER AND MONITORING CIRCUIT

(71) Applicant: QUALCOMM Incorporated, San Diego, CA (US)

(72) Inventor: Bo Sun, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 301 days.

(21) Appl. No.: 13/802,725

(22) Filed: Mar. 14, 2013

(65) Prior Publication Data

US 2014/0266127 A1 Sep. 18, 2014

(51) Int. Cl.
*G05F 1/10* (2006.01)
*G05F 3/08* (2006.01)
*G01R 15/04* (2006.01)
*G01R 15/08* (2006.01)
*G01R 15/09* (2006.01)
*G01R 19/165* (2006.01)
*G05F 1/46* (2006.01)

(52) U.S. Cl.
CPC .................. *G05F 3/08* (2013.01); *G01R 15/04* (2013.01); *G01R 15/08* (2013.01); *G01R 15/09* (2013.01); *G01R 19/16519* (2013.01); *G01R 19/16552* (2013.01); *G05F 1/465* (2013.01)

(58) Field of Classification Search
CPC ............... G05F 1/10; G05F 1/46; G05F 1/56; G05F 1/613
See application file for complete search history.

(56) References Cited

U.S. PATENT DOCUMENTS

| | | | |
|---|---|---|---|
| 4,651,084 A | 3/1987 | Welsh et al. | |
| 5,319,305 A | 6/1994 | Baba | |
| 6,385,547 B1 | 5/2002 | Bogli | |
| 7,119,529 B2 | 10/2006 | Kadner | |
| 7,262,653 B2 * | 8/2007 | Park et al. ...................... | 327/541 |
| 7,274,248 B2 * | 9/2007 | Okamoto ....................... | 327/536 |
| 8,013,643 B2 | 9/2011 | Weng | |
| 8,054,256 B2 | 11/2011 | Park Yong-Sung et al. | |
| 8,698,553 B2 * | 4/2014 | Jung ............................... | 327/540 |
| 2001/0030573 A1 | 10/2001 | Boehm et al. | |

FOREIGN PATENT DOCUMENTS

| | | |
|---|---|---|
| EP | 0604168 A1 | 6/1994 |
| EP | 2073024 A1 | 6/2009 |

OTHER PUBLICATIONS

International Search Report and Written Opinion—PCT/US2014/022711—ISA/EPO—Jul. 7, 2014.

(Continued)

*Primary Examiner* — Jeffrey Zweizig
(74) *Attorney, Agent, or Firm* — Haynes and Boone, LLP

(57) ABSTRACT

A voltage divider circuit is provided that automatically and dynamically adjusts its voltage divider chains as a supply voltage changes. The voltage divider circuit includes a plurality of voltage divider branches having different divider factors to divide the supply voltage and obtain a divided supply voltage. Additionally, a control circuit is coupled to the plurality of voltage divider branches and adapted to automatically monitor the supply voltage and dynamically select a voltage divider branch from among the plurality of voltage divider branches to maintain a selected divided supply voltage within a pre-determined voltage range.

28 Claims, 11 Drawing Sheets

(56) References Cited

OTHER PUBLICATIONS

Song S, "Design of a Low-Current Voltage Dividers", Aug. 1, 2011, pp. 1-18, XP055125287, Retrieved from the Internet: URL:http://scholarships.engin.umich.edu/wp-content/uploads/sites/36/2013/09/2011-Wang-Chu-Chien-Wen-Report-Shiming-Song.pdf [retrieved on Jun. 26, 2014], p. 4-6.

* cited by examiner

|  | 3xBranch | 4xBranch | 5xBranch | 6xBranch | 7xBranch | 8xBranch |
|---|---|---|---|---|---|---|
| Node_x | 0 | 0 | 0 | 1 | 1 | 1 |
| Select | 0 | 0 | 0 | 1 | 0 | 0 |
| Enable | 0 | 0 | 1 | 1 | 1 | 1 |

Selected → 6xBranch

FIG. 7A

|  | 3xBranch | 4xBranch | 5xBranch | 6xBranch | 7xBranch | 8xBranch |
|---|---|---|---|---|---|---|
| Node_x | 0 | 0 | 0 | 0 | 1 | 1 |
| Select | 0 | 0 | 0 | 0 | 1 | 0 |
| Enable | 0 | 0 | 0 | 1 | 1 | 1 |

Selected → 7xBranch

FIG. 7B

|  | 3xBranch | 4xBranch | 5xBranch | 6xBranch | 7xBranch | 8xBranch |
|---|---|---|---|---|---|---|
| Node_x | 0 | 0 | 1 | 1 | 1 | 1 |
| Select | 0 | 0 | 1 | 0 | 0 | 0 |
| Enable | 0 | 1 | 1 | 1 | 1 | 1 |

Selected → 5xBranch

FIG. 7C

LOW POWER AND DYNAMIC VOLTAGE DIVIDER AND MONITORING CIRCUIT

BACKGROUND

1. Field

Various features relate to voltage control and/or monitoring circuits, and more particularly to methods and apparatuses for automatically measuring voltage of a power supply while dynamically adjusting such voltage measurements as the supply voltage changes.

2. Background

The proliferation of portable electronic devices is dependent on reliable portable power supplies/sources. Commonly used power supplies for such portable electronic devices include, for example, non-rechargeable and rechargeable batteries, battery cells, and the like. Portable electronic devices include, but are not limited to, mobile phones, wireless phones, personal computing devices, handheld computing devices, digital book readers, digital tablets, digital music players, etc. Other types of devices that may also rely on portable power supplies include electric and/or hybrid vehicles, such as cars and/or bicycles.

The proper charging and/or power management of such battery powered devices often depends on the accurate monitoring of power levels of the portable power supply (e.g., batteries, etc.). The portable power supply voltage varies depending the charge in the power supply, temperature, and/or load conditions. Portable power supply voltage is often monitored for various functions like low voltage cut off to protect the portable power supply/source e.g., battery), proper operation of a device, etc. Some present implementations for this monitoring function typically use a large resistor array to divide down the portable power supply (e.g., battery) voltage. The purpose of such large resistor array is to divide the power supply voltage sufficiently (e.g., to within a pre-defined range) that allows comparison to a reference band gap voltage, thereby ascertaining an actual voltage of the power supply. However, the large resistors, used to perform continuous voltage monitoring while saving power, often result take up a large footprint which is undesirable when implementing such monitoring function with a silicon die. In an alternative approach, a low-power switched capacitor circuit can be used to monitor/measure the voltage for a power supply, but this approach needs a clock source, which is not practical and/or desirable in many cases.

Therefore, there exists a need for a voltage divider circuit that overcomes the disadvantages of prior art voltage divider structures to permit efficient measuring/monitoring of voltages for a power supply.

SUMMARY

A voltage divider circuit is provided a plurality of voltage divider branches and a control branch. The plurality of voltage divider branches may have different divider factors to divide a supply voltage and obtain a divided supply voltage. The control circuit may be adapted to automatically monitor the supply voltage and dynamically select a voltage divider branch from among the plurality of voltage divider branches to maintain a selected divided supply voltage within a predetermined voltage range.

Each of the voltage divider branches may provide a different divided supply voltage and the selected divided supply voltage corresponds to the selected voltage divider branch. Each voltage divider branch may include (a) a divider chain that is coupled to the control circuit, and/or (b) a control chain coupled to the control circuit, wherein the control circuit activates and deactivates the divider chain based on a voltage sensed on the control chain. The divided supply voltage may be obtained from the divider chain.

In one example, the plurality of voltage divider branches includes: (a) a first voltage divider branch having a first control chain and a first divider chain of a first divider factor, (b) a second voltage divider branch having a second control chain and a second divider chain of a second divider factor, where the second divider factor is greater than the first divider factor, and/or (c) a third voltage divider branch having a third control chain and a third divider of a third divider factor, where the third divider factor is greater than the second divider factor. When the second voltage divider branch is selected by the control circuit the first divider chain and third divider chain are disabled and the second divider chain is enabled while the first, second, and third control chains are enabled.

In one exemplary implementation, the divider chain may include a plurality of transistors coupled in series, with each voltage divider branch having a divider chain with a different number of transistors. The gate of each transistor in the divider chain may be coupled to the drain of that transistor, and the drain of a first transistor in the divider chain is coupled to the source of a next transistor in the divider chain.

The control chain may include a plurality of transistors coupled in series, with each voltage divider branch having a different number of transistors. In one example, the control chain may include: (a) a resistive chain of transistors coupled in series, with the gate of each transistor coupled to its drain, and/or (b) a monitoring chain having two transistors coupled in series, the gate of each of the first two transistors in the resistive chain coupled to the gate of a corresponding transistor in the monitoring chain. The resistive chain of transistors may have an equal number of transistors in series as the divider chain.

In one example, the control circuit may dynamically and/or automatically select the voltage divider branch as the supply voltage changes. For instance, the control circuit may operate to deactivate a previously-selected voltage divider branch when the voltage divider branch is selected. Deactivating a previously-selected voltage divider branch may include deselecting a corresponding divider chain for the previously-selected voltage divider branch while maintaining a control chain enabled.

Similarly a method of operating a voltage divider circuit is provided. A first voltage divider branch is selected from a plurality of voltage divider branches having different divider factors to divide a supply voltage and obtain a divided supply voltage. The supply voltage is then monitored. A second voltage divider branch is dynamically selected from among the plurality of voltage divider branches as the supply voltage changes to maintain the divided supply voltage within a predetermined voltage range. The first voltage divider branch may be deactivated when the second voltage divider branch is selected. In one example, deactivating the first voltage divider branch includes deselecting a corresponding divider chain for first voltage divider branch while maintaining a control chain enabled.

In one example, each of the plurality of voltage divider branches may include: (a) a divider chain, and/or (b) a control chain that causes the divider chain to be activated or deactivated based on a voltage sensed on the control chain. The divided supply voltage may be obtained from the divider chain.

In one example, a plurality of voltage divider branches includes: (a) the first voltage divider branch having a first control chain and a first divider chain of a first divider factor, (b) the second voltage divider branch having a second control chain and a second divider chain of a second divider factor, where the second divider factor is greater than the first divider factor, and/or (c) a third voltage divider branch having a third control chain and a third divider of a third divider factor, where the third divider factor is greater than the second divider factor. When the second voltage divider branch is selected by the control circuit the first divider chain and third divider chain are disabled and the second divider chain is enabled while the first, second, and third control chains are enabled.

In some implementations, the divider chain may include a plurality of transistors coupled in series, with each voltage divider branch having a divider chain with a different number of transistors. The gate of each transistor in the divider chain is coupled to the drain of that transistor, and the drain of a first transistor in the divider chain is coupled to the source of a next transistor in the divider chain.

In some implementations, the control chain may include a plurality of transistors coupled in series, with each voltage divider branch having a different number of transistors. For example, the control chain may include: (a) a resistive chain of transistors coupled in series, with the gate of each transistor in the resistive chain coupled to its drain, and/or (b) a monitoring chain having two transistors coupled in series, the gate of each of the first two transistors in the resistive chain coupled to the gate of a corresponding transistor in the monitoring chain. The resistive chain of transistors may have an equal number of transistors in series as the resistor chain.

BRIEF DESCRIPTION OF THE DRAWINGS

FIG. 7A is a table illustrating the selection of a first divider branch and enablement of control circuits for a plurality of other divider branches.

FIG. 7B is a table illustrating the selection of a second divider branch and enablement of control circuits for a plurality of other divider branches.

FIG. 7C is a table illustrating the selection of a third divider branch and enablement of control circuits for a plurality of other divider branches.

DETAILED DESCRIPTION

The illustrations presented herein are, in some instances, not actual views of any particular protrusions, heat dissipation features or electronic devices, but are merely idealized representations which are employed to describe various aspects relating to the present disclosure. Additionally, elements common between figures may retain the same numerical designation.

Overview

A voltage divider circuit is provided that automatically and dynamically adjusts its voltage divider chains as a supply voltage changes. The voltage divider circuit includes a plurality of voltage divider branches having different divider factors to divide the supply voltage and obtain a divided supply voltage. Additionally, a control circuit is coupled to the plurality of voltage divider branches and adapted to automatically monitor the supply voltage and dynamically select a voltage divider branch from among the plurality of voltage divider branches so as to maintain the divided supply voltage within a desired voltage range as the supply voltage changes.

Exemplary Automatic Voltage Divider Circuit

Figure 1:
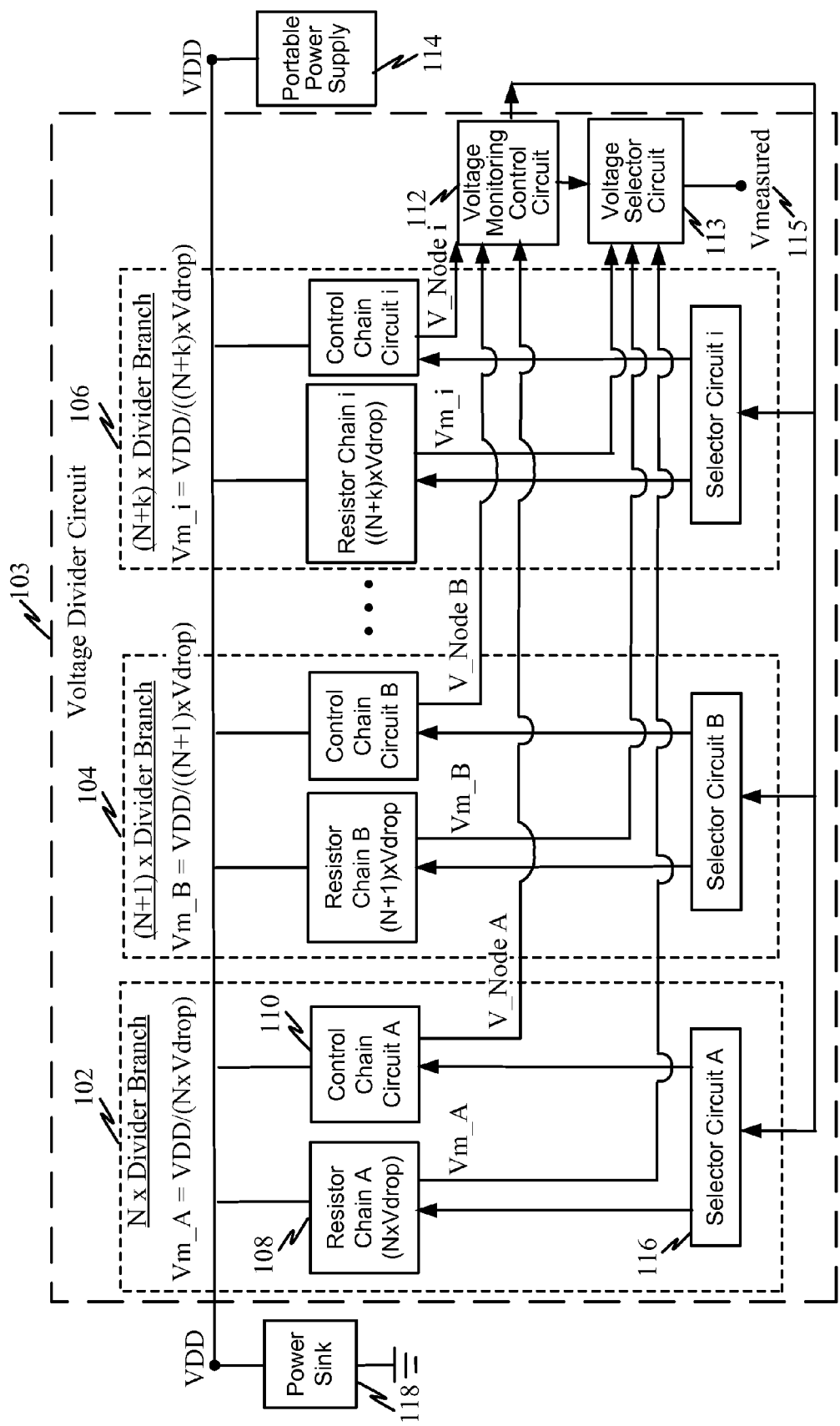
FIG. 1 illustrates an exemplary voltage divider circuit that automatically switches between voltage divider chains depending on the supply voltage level (VDD) sensed.

FIG. 1 illustrates an exemplary voltage divider circuit that automatically switches between voltage divider chains depending on the supply voltage level (VDD) sensed. A portable power supply 114 is often used to power one or more device, referred herein as power sink 118. The power sink 118 may be one or more electronic component or device, such as a processing circuit, transceiver circuit, memory device, storage device, display device, etc., the operates on electric power. For proper operation, the power sink 118 expects a supply voltage (VDD) from the portable power supply 114 within a particular voltage range. However, the voltage level (referred to as source voltage or supply voltage VDD) of the portable power supply 114 changes as it is depleted.

In order to accurately measure the supply voltage level as it changes (e.g., as the supply voltage VDD is depleted), a voltage divider circuit 103 is placed between the portable power supply 114 and the power sink 118 that consumes power from the portable power supply 114. The purpose of the voltage divider circuit 103 is to provide a measured supply voltage (Vmeasured) 115 that remains within a given range even though the supply voltage (VDD) from the portable power supply 114 drops or changes over time.

The voltage divider circuit 103 may include a plurality of divider branches 102, 104, and 106 that enabled or disabled to maintain the measured supply voltage (Vmeasured) 115 within a desired voltage range as the supply voltage (VDD) drops or changes over time. The purpose of such voltage divider circuit 103 is to divide the power supply voltage VDD sufficiently (e.g., to within a predefined range) that allows comparison to a reference band gap voltage, thereby ascertaining an actual voltage of the power supply. If just one voltage divisor is used as the supply voltage VDD drops, then the divided supply voltage may become too small for accurate comparison to the reference band gap voltage. Consequently, the voltage divider circuit 102 automatically adjusts the voltage divider value (divisor) as the supply voltage VDD changes (e.g., drops when the power supply 114 discharges or increases when the power supply 114 charges).

In this example, each divider branch 102, 104, and 106 may comprise a resistor chain 108, a control chain circuit 110, and a selector circuit 116. Each divider branch 102, 104, and 106 may be adapted to divide the supply voltage VDD from the portable power supply 114 (e.g., battery, etc.) by a different factor. For instance, a first voltage divider branch 102 may divide the supply voltage VDD by a first factor N×Vdrop (where Vdrop is a voltage drop associated with elements in the corresponding resistor chain 108 and N is the number of elements or voltage drops in such resistor chain) to provide a first divided supply voltage Vm-A. In this example, the first divided supply voltage Vm_A may be equal to VDD/(N×Vdrop). Similarly, a second voltage divider branch 104 may divide the supply voltage VDD by a second factor (N+1)×Vdrop to provide a second divided supply voltage Vm-B. In this example, the second divided supply voltage Vm_B may be equal to VDD/((N+1)×Vdrop). Likewise, additional voltage divider branches 106 may divide the supply voltage VDD by other factors, such as (N+k)×Vdrop (where k is an positive or negative integer) to provide a divided supply voltage Vm_i. In this example, the divided supply voltage Vm-i may be equal to VDD/((N+k)×Vdrop).

Each resistor chain 108 may include a series of resistive elements to effectuate a division of the supply voltage VDD. The factor by which the supply voltage VDD is divided depends on the number of elements (e.g., transistors) in each resistor chain, where each element accounts a divisor of Vdrop. The resistive elements may have relatively high impedance to minimize the current drawn from the portable power supply 114.

The control chain circuit 110 in each divider branch 102, 104, and 106 may serve to determine when each divider branch 102, 104, and 106 should be activated (enabled) or deactivated (disabled) such that only one branch is activated at any one time. A node voltage V_Node x from the control chain circuit 110 is provided to a voltage monitoring control circuit 112 which determines when to activate or deactivate a particular divider branch 102, 104, and 106. A divided supply voltage Vm_A, Vm_B, Vm_i is provided from the resistor chain 108 of each divider branch 102, 104, and 106 to a voltage selector circuit 113. The voltage monitoring control circuit 112 selects one of the divided supply voltages Vm_A, Vm_B, Vm_i as the measured voltage Vmeasured 115 depending on which divider branch 102, 104, and 106 is currently activated. This allows maintaining the measured voltage Vmeasured 115 within specific voltage range as the supply voltage changes.

Each of the resistor chains 102, 104, and 106 may be automatically activated or deactivated by their corresponding control chain circuit 110 and voltage monitoring control circuit 112 depending on the supply voltage VDD level sensed. For instance, a selector circuit 116 in each divider branch 102, 104, and 106 may be controlled by the voltage monitoring control circuit 112 to select and/or deselect each divider branch 102, 104, and 106. This way, only one voltage divider branch may be active at a time, and the active voltage divider branch is selected so that the measured voltage Vmeasured 115 falls within a desired voltage range.

The control chain circuit(s) 110 and/or voltage monitoring control circuit 112 dynamically and automatically select the appropriate voltage branch divider branch as the supply voltage VDD changes over time. For instance, the control chain circuit(s) 110 and/or voltage monitoring control circuit 112 may dynamically operate to select a voltage divider branch 102, 104, or 106 to maintain the measured voltage Vmeasured 115 within a pre-determined voltage range (e.g., a threshold range).

Figure 2:
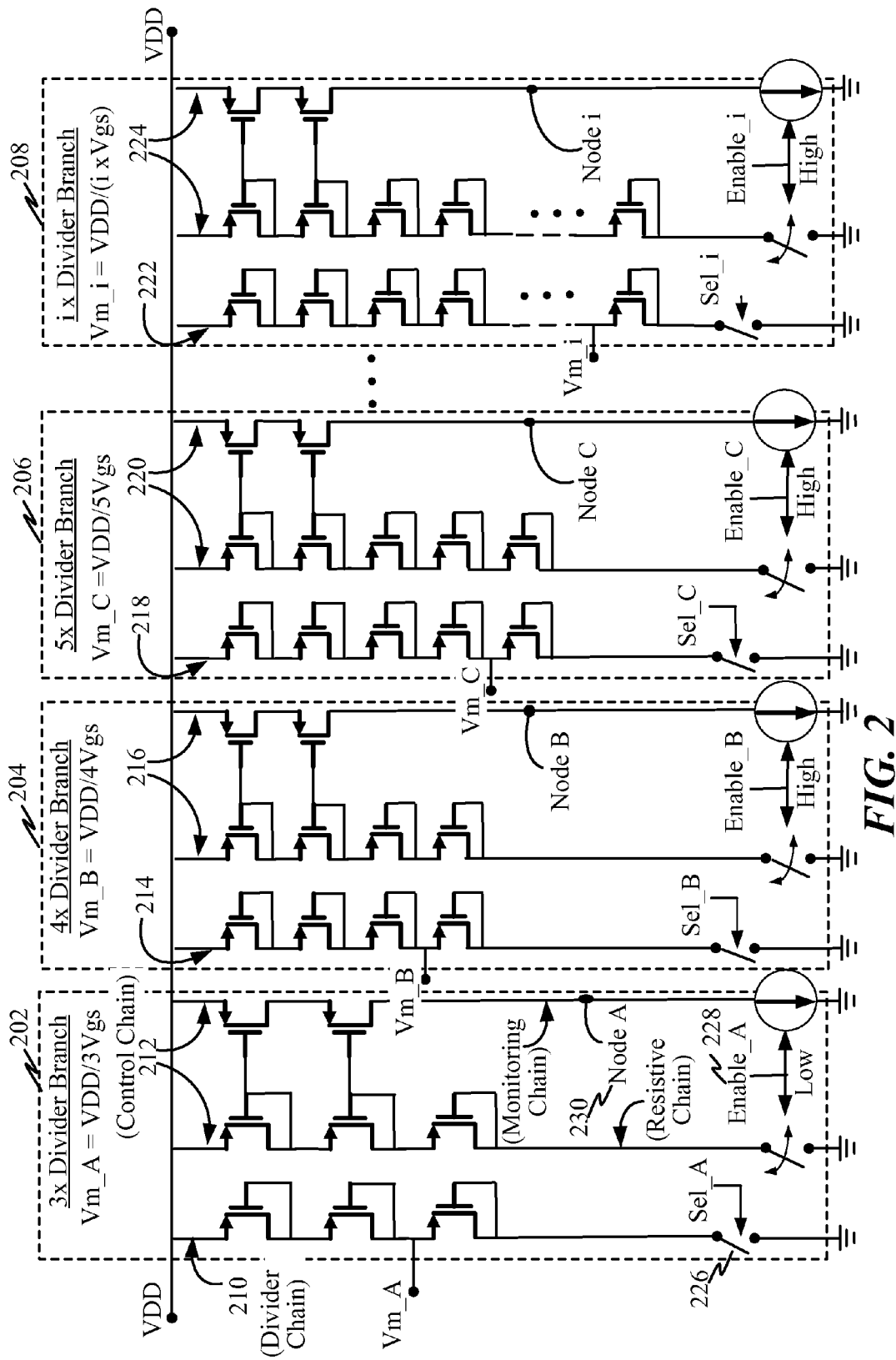
FIG. 2 illustrates another exemplary voltage divider circuit that automatically switches between voltage divider branches depending on the supply voltage level sensed.
Figure 3:
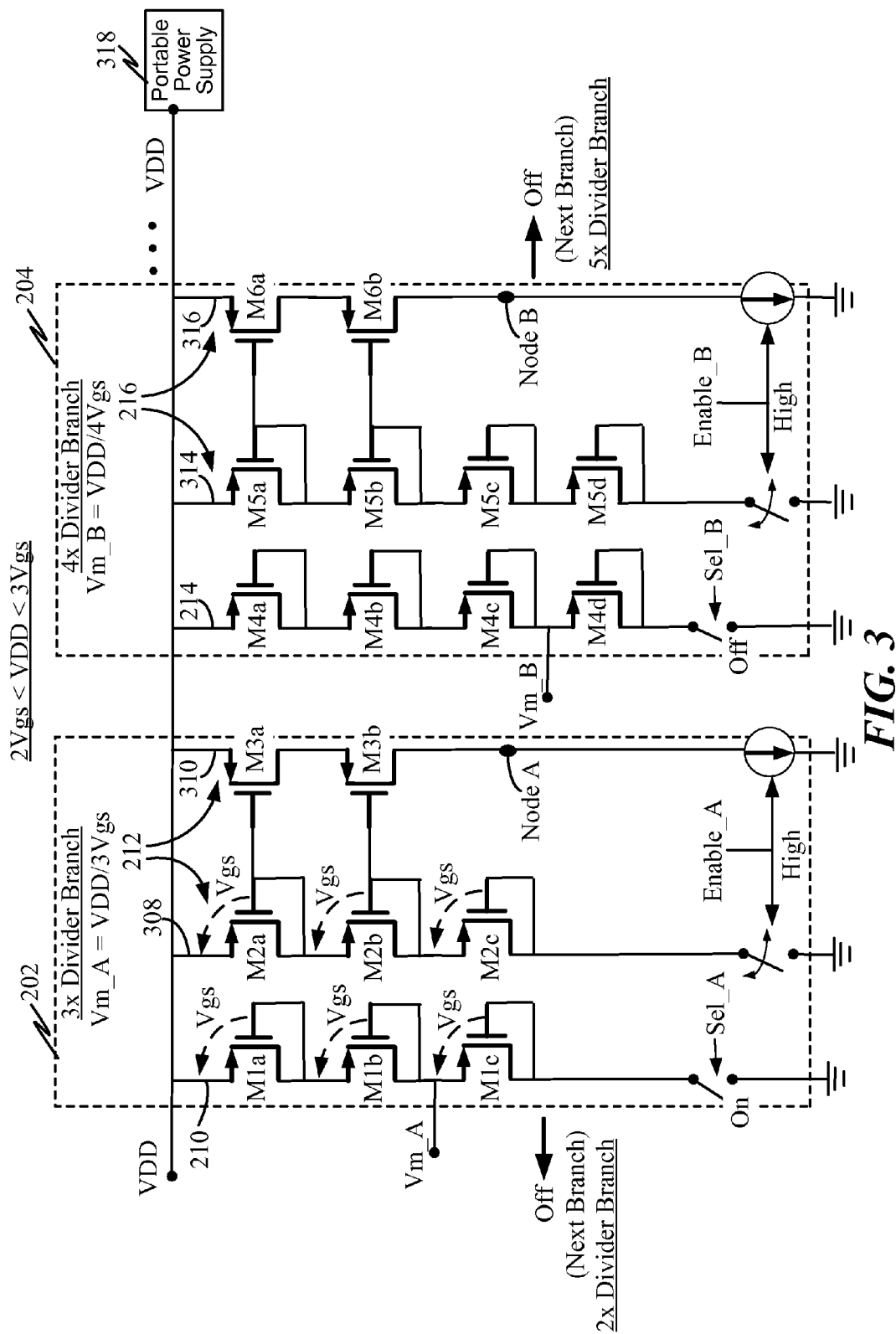
FIG. 3 illustrates the operation of the voltage divider circuit of FIG. 2 when the supply voltage VDD is greater than 2Vgs but less than 3Vgs.

FIG. 2 illustrates another exemplary voltage divider circuit that automatically switches between voltage divider branches depending on the supply voltage level VDD sensed. In this example, each divider branch 202, 204, 206, and 208 comprises a divider chain 210, 214, 218, and 222 and a control chain 212, 216, 220, and 224, respectively. Each divider chain 210, 214, 218, and 222 may include series of transistors (e.g., field effect transistor) to effectuate a division of a supply voltage VDD. The divided supply voltage Vm_x may be measured between the last and second to last transistor in each of the divider chains 210, 214, 218, and 222. One of the divided supply voltages Vm_A, Vm_B, Vm_C, Vm_i may then be selected as the measured voltage 115 based on which divider branch is currently selected. The factor by which the supply voltage VDD is divided depends on the number of transistors in each divider chain 210, 214, 218, and 222, where each transistor accounts for a divisor of Vgs (i.e., gate-to-source voltage for each transistor). Each of the divider chains 210, 214, 218, and 222 may be automatically activated or deactivated by their corresponding control chain 212, 216, 220, and 224 depending on the supply voltage VDD level sensed. For instance, as illustrated in FIG. 3, a first divider branch 202 may include a first divider chain 210 having three (3) transistors in series to provide an approximately 3×Vgs divider factor. Similarly, a second divider branch 204 may include a second divider chain 214 having four (4) transistors in series to provide an approximately 4×Vgs divider factor. Similarly, additional divider branches 206 and 208 with greater and/or fewer transistors in their respective divider chains may be provided. For each divider chain 210, 214, 218, and 222, the transistors are coupled in series, with the gate of each transistor coupled to the drain, and the drain of a first transistor coupled to the source of the next transistor. Consequently, a known reference gate-to-source voltage drop Vgs is present across each transistor in the resistor chain. The divided supply voltage for each divider chain (e.g., voltages Vm-A, Vm-B, Vm-i) is taken between the last transistor and second to last transistor in each divider chain. Note that since only one divider chain 210, 214, 218 and 222 may be selected at any one time, only the currently selected divider chain may have a divided supply voltage. The divided supply voltages Vm_A, Vm_B, Vm_C, Vm_i are then sent to a voltage selector circuit (e.g., a multiplexer) which is controlled by a voltage monitoring control circuit to provide the divided supply voltage of the currently selected divider branch as the measured voltage Vmeasured.

The control chain 212, 216, 220, and 224 for each divider branch 202, 204, 206, and 208 may include a circuit that automatically switches between the divider branches 202, 204, 206, and 208. As illustrated in FIG. 3, the divider chain of each divider branch 202, 204, 206, and 208 may be turned On or Off (by an enable signal) depending on the value of the supply voltage VDD for the portable power supply 318.

The control chains are configured to automatically and dynamically activate and deactivate (e.g., select or deselect) a divider branch (and/or divider chain). As illustrated in FIG. 3, the first control chain 212 may include a first resistive chain 308 and a first monitoring chain 310 and the second control chain 216 may include a second resistive chain 314 and a second monitoring chain 316. The first resistive chain 308 may include three transistors M2a, M2b, and M2c coupled in series, with the gate of each transistor coupled to the drain, and the drain of a first transistor coupled to the source of the next transistor and so on. The first monitoring chain 310 has two transistors coupled in series, the gate of each of the first two transistors in the first resistive chain 308 coupled to the gate of a corresponding transistor in the first monitoring chain 310. The first resistive chain 308 also includes a switch that is activated/deactivated (e.g., closed or opened) by a first enable signal Enable_A while the first monitoring chain 310 includes a current source that is also activated/deactivated by the first enable signal Enable_A. The second resistive chain 314 and second monitoring chain 316 are similarly automatically and/or dynamically enabled/disabled by a switch and/or current source using a second enable signal Enable_B. Each transistor in the divider chains 210/214 and resistive chains 308/314 has a gate-to-source voltage drop Vgs. For example, voltage drop Vgs may be at a particular current flow (e.g., 10 nA) through a chain. Thus, the number of transistors in each divider chain and resistive chain serve to define a known voltage divisor.

If the supply voltage VDD is less than 3×Vgs, the current at transistors M2a, M2b, and/or M2c (of the first resistive chain 308) is less than 10 nano-amps (nA) and the same current is mirrored to transistors M3a and M3b (i.e., less than 10 nA) (in the first monitoring chain 310). When Node A of the first divider branch 202 is pulled "low", the first divider chain 210 will be active and the remaining divider chains 214, 218, and 222 will be inactive.

Figure 4:
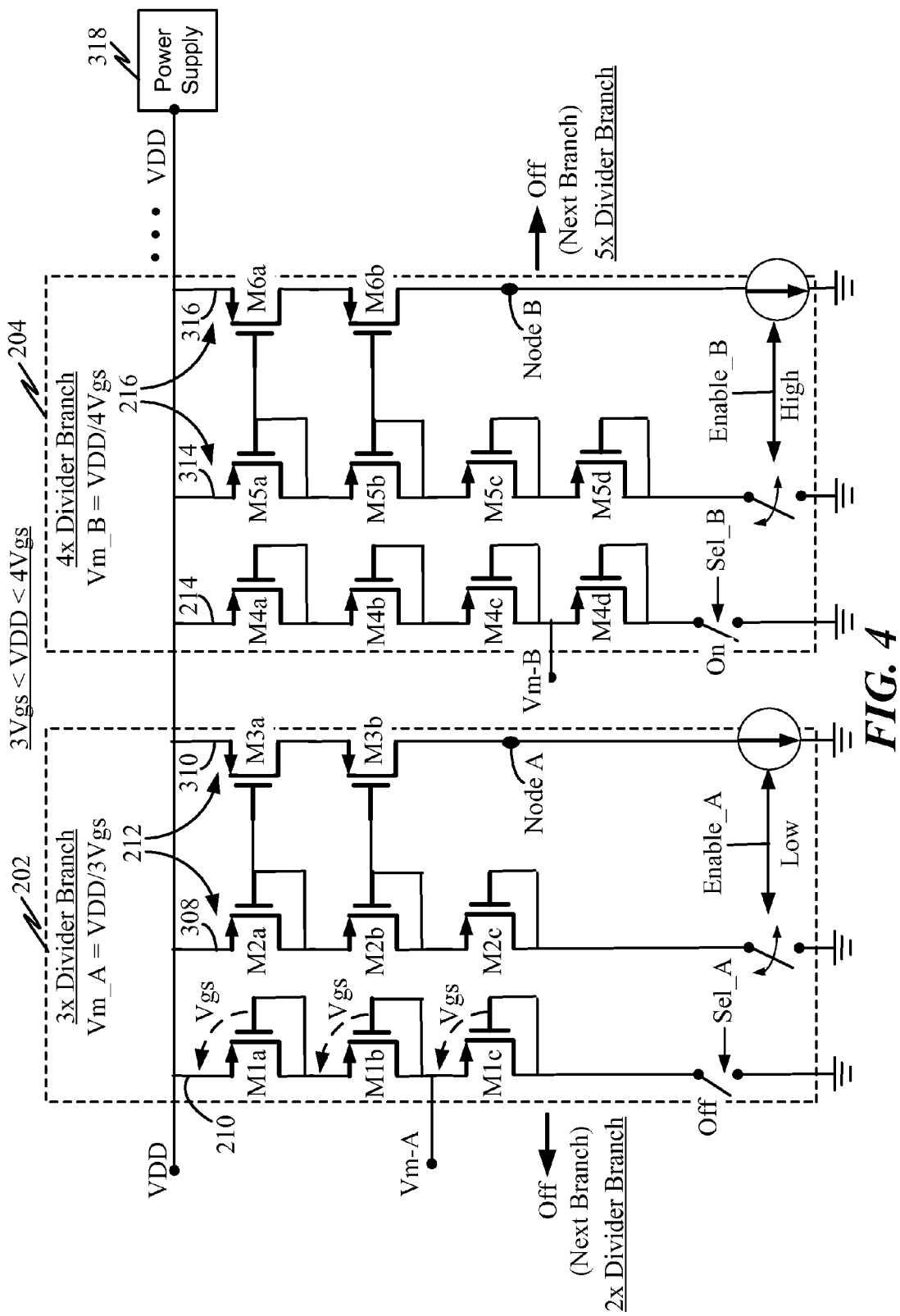
FIG. 4 illustrates the operation of the voltage divider circuit of FIG. 2 when the supply voltage VDD is greater than 3Vgs but less than 4Vgs.

If the supply voltage VDD is greater than 3×Vgs (as illustrated in FIG. 4), the first divider chain 210 will be inactive, the current at transistor M5a, M5b, M5c, and/or M5d (in the second resistive chain 314) is less than 10 nA and the same current is mirrored to transistors M6a and M6b (i.e., less than 10 nA) (in the second monitoring chain 316). Node B of the second divider branch 204 is pulled "low", the second divider chain 214 will be active and the remaining divider chains 210, 218, and 222 will be inactive.

In this same manner, as the supply voltage VDD changes from a full charge to a low charge or from a low charge to a full charge, the appropriate divider branch is automatically and/or dynamically activated while others are deactivated.

The voltage monitoring control circuit 112 (FIG. 1) may serve to activate or deactivate each divider branch 202, 204, 206, and 208 depending on the current source/supply voltage level. For instance, a switch 226 for the first resistor chain 210 and current sources 228 for the control chain 212 may serve to activate or deactivate the first divider branch 202 based on the voltage level at Node A 230. Similarly, the voltage levels at Node B, Node C, Node i, etc., may be used to activate or deactivate the divider branches 204, 206 and/or 208. Thus, the voltage monitoring control circuit 112 may use the voltage level at the Nodes A, B, C, and/or i, to enable or disable the appropriate chains. The voltage monitoring control circuit 112 (FIG. 1) may be implemented in various ways.

Figure 5:
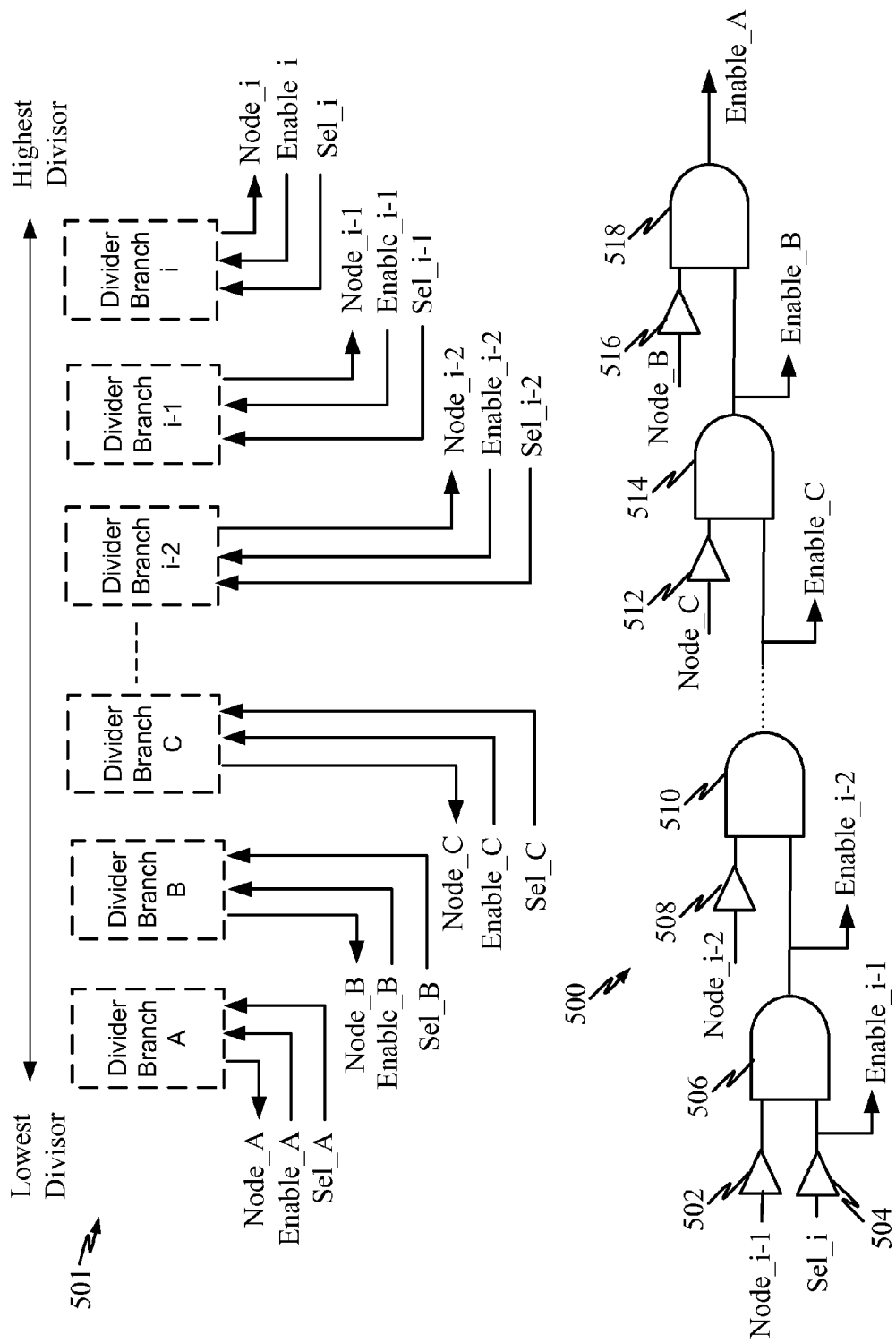
FIG. 5 illustrates a logic circuit for an exemplary voltage monitoring control circuit that automatically enables one or more control branches of the voltage divider branches depending on the supply voltage sensed.

FIG. 5 illustrates a logic circuit for an exemplary voltage monitoring control circuit that automatically enables one or more control branches of the voltage divider branches depending on the supply voltage sensed. A diagram 501 of the divider branches notations and their corresponding input and outputs are shown for reference to the logic circuit 500. Here, the voltage level at the "Node" point of each control branch (see FIG. 2) is interpreted as either high (1) or low (0) and used as an input to an AND gate along with the Enable value (e.g., high or low) of the next lowest divider branch. The logic circuit 500 may include a plurality of AND gates 506, 510, 514, and 518 coupled in series, with the output of an AND gate serving as an input to the next AND gate. A voltage level Node_i−1 for a second divider branch i−1 and the selection signal Sel_i (e.g., high or low) for first divider branch i are inverted by inverters 502 and 504, respectively, and serve as inputs to a first AND gate 506. The inverted selection signal Sel_i serves as the enable signal Enable_i−1 for the control chain of second branch i−1. The output of the first AND gate 506 serves as the enable signal Enable_i−2 for the control branch of the third branch i−2. A voltage level Node_i−2 for the third divider branch i−2 is inverted by inverted 508 and together with the output from the first AND gate 506 serve as input to a second AND gate 510. This process is repeated with additional Node voltages for different divider branches to obtain the enable signals Enable_C, Enable, B, Enable A for control chains of additional divider branches.

Figure 6:
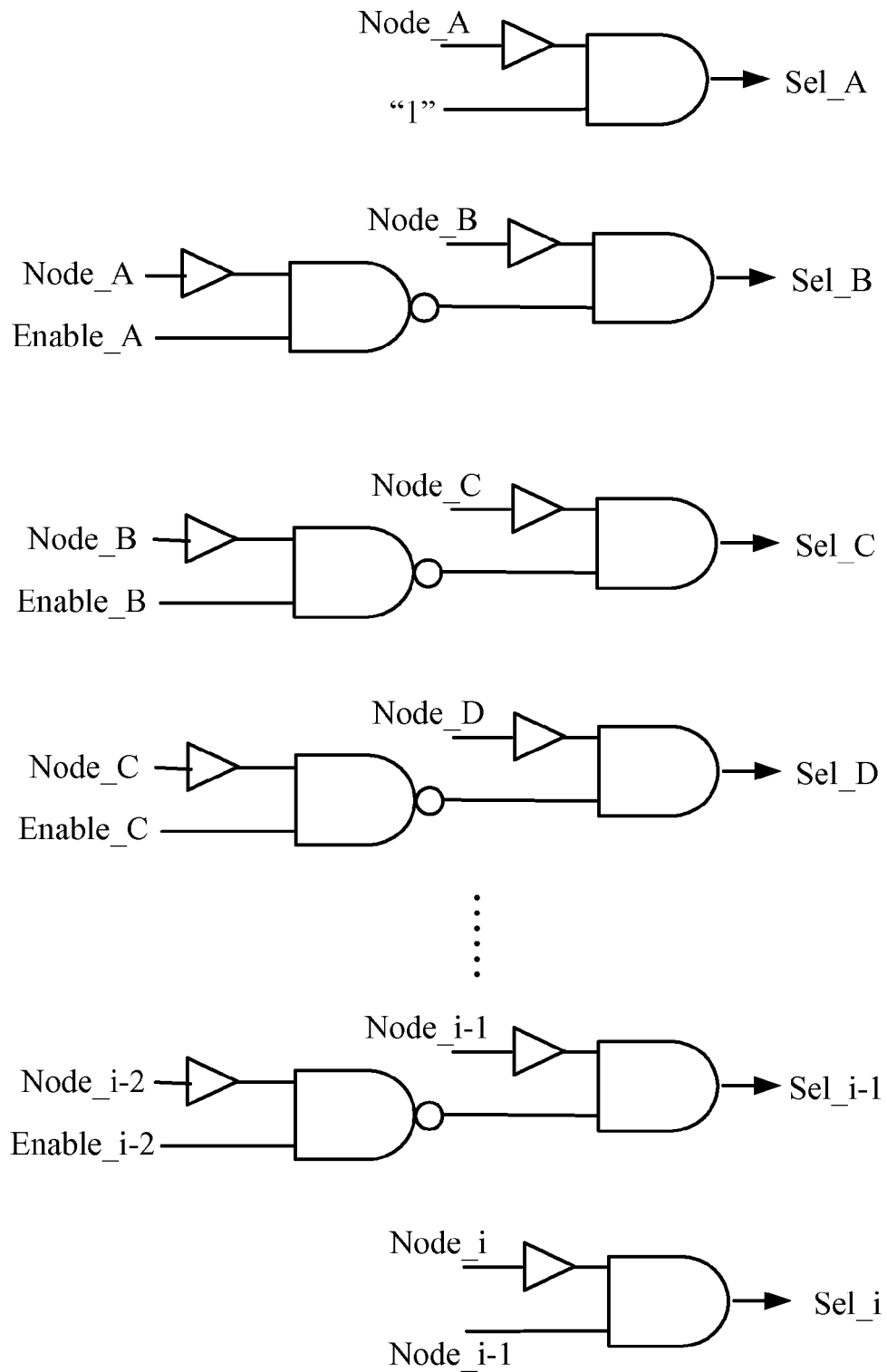
FIG. 6 illustrates various logic circuits that automatically activate/deactivate a divider chain within a voltage divider branch.

FIG. 6 illustrates various logic circuits that automatically select (activates/deactivates) a divider chain within a divider branch based on the Enable state of a next lowest divider branch (i.e., divider branch with next lowest divisor), the voltage level at the "Node" point of the next lowest divider branch, and the voltage level for the "Node" point for the current divider branch. The inputs and outputs illustrated in FIG. 6 correspond to the diagram 501 of divider branches. For example, the Select_C signal is generated by inverting the value of Node_B (which is in the next divider branch with a lower divisor). Then the inverted Node_B value and Enable_B signal value are NANDed and the result is ANDed with the inverted Node_C voltage to obtain the Select_C signal.

Note the voltage at a "Node" point (e.g., Node-A, Node-B, Node-C, etc.) is analog voltage. When used as an input to a CMOS (complementary metal-oxide-semiconductor) logic device (e.g., a CMOS logic gate input for AND, NAND, inverter, etc.), the voltage level serves as a logic input. For example, when the voltage level >½CMOS logic circuit supply, it is considered a logical 1 or high, and when the voltage level <½ CMOS logic circuit supply, it is considered a logical 0 or low.

In one example, the highest divider branch may be selected initially, as a default, to allow the enable circuit (FIG. 5) and selection circuit (FIG. 6) to operate and seek the correct resistor chain of a divider branch for a given voltage supply VDD level.

Figure 13:
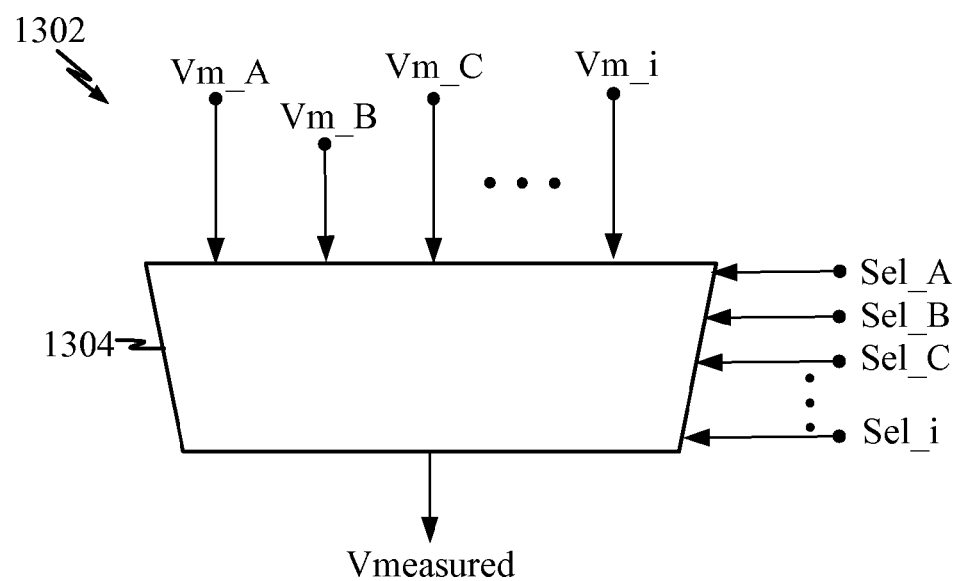
FIG. 13 illustrates an example of a voltage selector circuit that selects between a plurality of divided voltage inputs to provide a measured voltage.

FIG. 13 illustrates an example of a voltage selector circuit 1302 that selects between a plurality of divided supply voltage inputs to provide a measured voltage. The selector circuit 1302 is one example of the voltage selector circuit 113 in FIG. 1. A plurality of divided supply voltages Vm_A, Vm_B, Vm_C, . . . Vm_i may be obtained from a corresponding plurality of voltage divider branches (e.g., as illustrated in FIGS. 1, 2, 3, 4). In this example, a multiplexer 1304 receives the divided supply voltage inputs and selects one based on an active selection signal (e.g., Sel_A, Sel_B, Sel_C, . . . Sel_i) from a voltage monitoring control circuit. For example, the selection outputs from the various logic circuits in FIG. 6, which are used to automatically select (activates/deactivates) a divider chain, may also be used to select a divided supply voltage Vm_A, Vm_B, Vm_C, . . . or Vm_i as the measured voltage Vmeasured. For instance, the divided supply voltage corresponding to the currently selected divider chain may be selected as the measured voltage. In this manner, the measured voltage Vmeasured may be maintained within a predetermined voltage range even as the supply voltage changes. Note that the voltage monitoring control circuit 112 knows the divisor factor for the currently (presently) selected divider branch and can thus compute an accurate voltage level for the power supply 114.

FIG. 7A is a table illustrating the selection of a first divider branch and enablement of control circuits for a plurality of other divider branches. This table may be constructed from the circuits illustrated in FIGS. 1-6. When the 6×Branch is currently selected as the divider branch, the control circuits for branches 5×Branch, 7×Branch, and 8×Branch are enabled. It should be noted that while only a few divider branches are illustrated, additional divider branches (e.g., greater than the 8× divider branch and/or less than the 3× divider branch) may be used.

FIG. 7B is a table illustrating the selection of a second divider branch and enablement of control circuits for a plurality of other divider branches. When the 7×Branch is currently selected as the divider branch, the control circuits for branches 6×Branch, 7×Branch, and 8×Branch are enabled.

FIG. 7C is a table illustrating the selection of a third divider branch and enablement of control circuits for a plurality of other divider branches. When the 5×Branch is currently selected as the divider branch, the control circuits for branches 4×Branch, 6×Branch, 7×Branch, and 8×Branch are enabled.

From FIGS. 7A, 7B, and 7C it a can be appreciated that when a particular divider branch is selected, the control circuits for the divider branch with the next lowest divisor factor is enabled. It can also be appreciated that, for a particular divider branch, the control circuits for the divider branches with higher divisor factors are also enabled.

Figure 8:
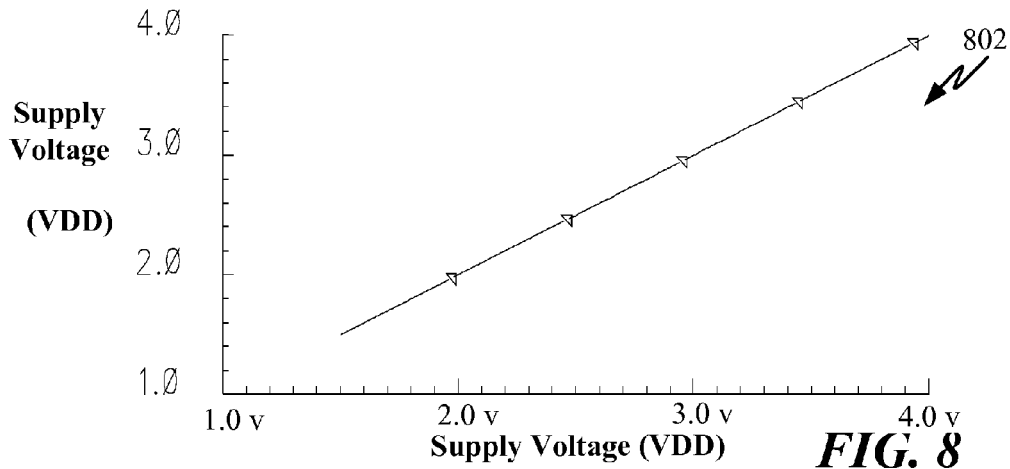
FIG. 8 is a graph illustrating the supply voltage VDD from a portable power source.

FIG. 8 is a graph 802 illustrating the supply voltage VDD from a portable power source. As previously noted, the supply voltage VDD provided by a power supply may decrease over time.

Figure 9:
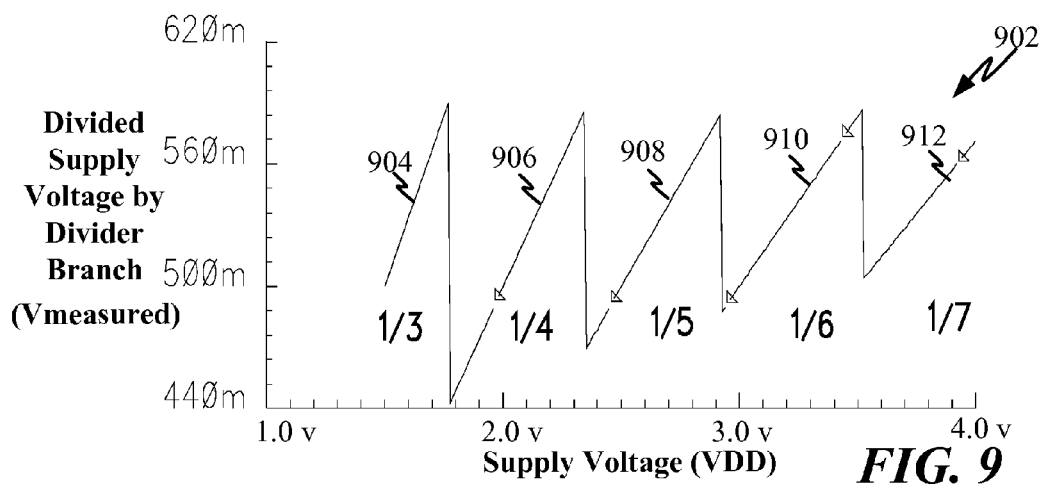
FIG. 9 is a graph illustrating the divider branch monitoring chain divided voltage as a function of the supply voltage VDD of FIG. 8.

FIG. 9 is a graph 902 illustrating the divider branch monitoring chain output as a function of the supply voltage VDD of FIG. 8. This graph 902 illustrates that as the supply voltage VDD changes, different divider branches are enabled and disabled and the enabled divider branch monitoring chain node voltage (e.g., from Node A, Node B, Node C, Node i, etc., in FIG. 2) varies according to the selected divider branch.

In graph 902, the divider branches are denoted as "⅓", "¼", "⅕", "⅙", "⅐", but correspond to the "3×", "4×", 5×", 6×", and "7×" divider branches, respectively, in FIGS. 2, 3, and/or 4. For example, when the supply voltage VDD is greater than about 3.5V, the 7× divider branch is active as indicated by the "⅐" label in FIG. 9. The 7× divider branch divides the supply voltage (e.g., 3.5V) by a factor of seven (7) so that the divided supply voltage (Vm−7×) is approximately 0.5V. Note that while the divided voltage for each branch changes as the divisor decreases, the measured voltage (Vmeasured) remains within an acceptable range of voltages (e.g., between 440 mV and 590 mV). Thus, one example of the pre-determined voltage range is 440 mV and 590 mV, but many other ranges are contemplated herein.

Here, a first graph segment 904 corresponds to the divided supply voltage of the "3×" divider branch (e.g., divider branch 202 in FIG. 2), a second graph segment 906 corresponds to the divided supply voltage of the "4×" divider branch (e.g., divider branch 204 in FIG. 2), a third graph segment 908 corresponds to the divided supply voltage of the "5×" divider branch (e.g., divider branch 206 in FIG. 2), a fourth graph segment 910 corresponds to the divided supply voltage of the "6×" divider branch, and a fifth graph segment 912 corresponds to the divided supply voltage of the "7×" divider branch.

Figure 10:
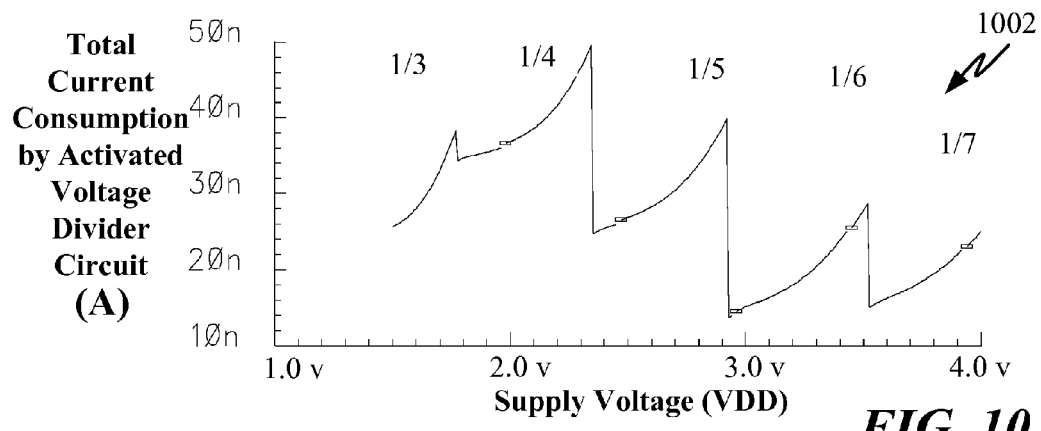
FIG. 10 is a graph illustrating the total current used by the voltage divider circuit as various divider branches are activated and deactivated.

FIG. 10 is a graph 1002 illustrating the total current used by the voltage divider circuit as various divider branches are activated and deactivated. As the supply voltage VDD decreases and different voltage divider branches are activated, the total current drawn by the voltage divider circuit. It can be appreciated here that when the supply voltage VDD drops and the lower divisor value branches are activated, a greater amount of current is used by the voltage divider circuit. This is because when the lower the divider branches are selected, the control chains for the higher divider branches are enabled, as illustrated in FIGS. 7A-C, which cause more power to be consumed by the voltage divider circuit. Conversely when the supply voltage VDD is higher and the higher divisor value branches are activated, fewer of the control chains for the higher divider branches are enabled, thereby consuming less power.

Figure 11:
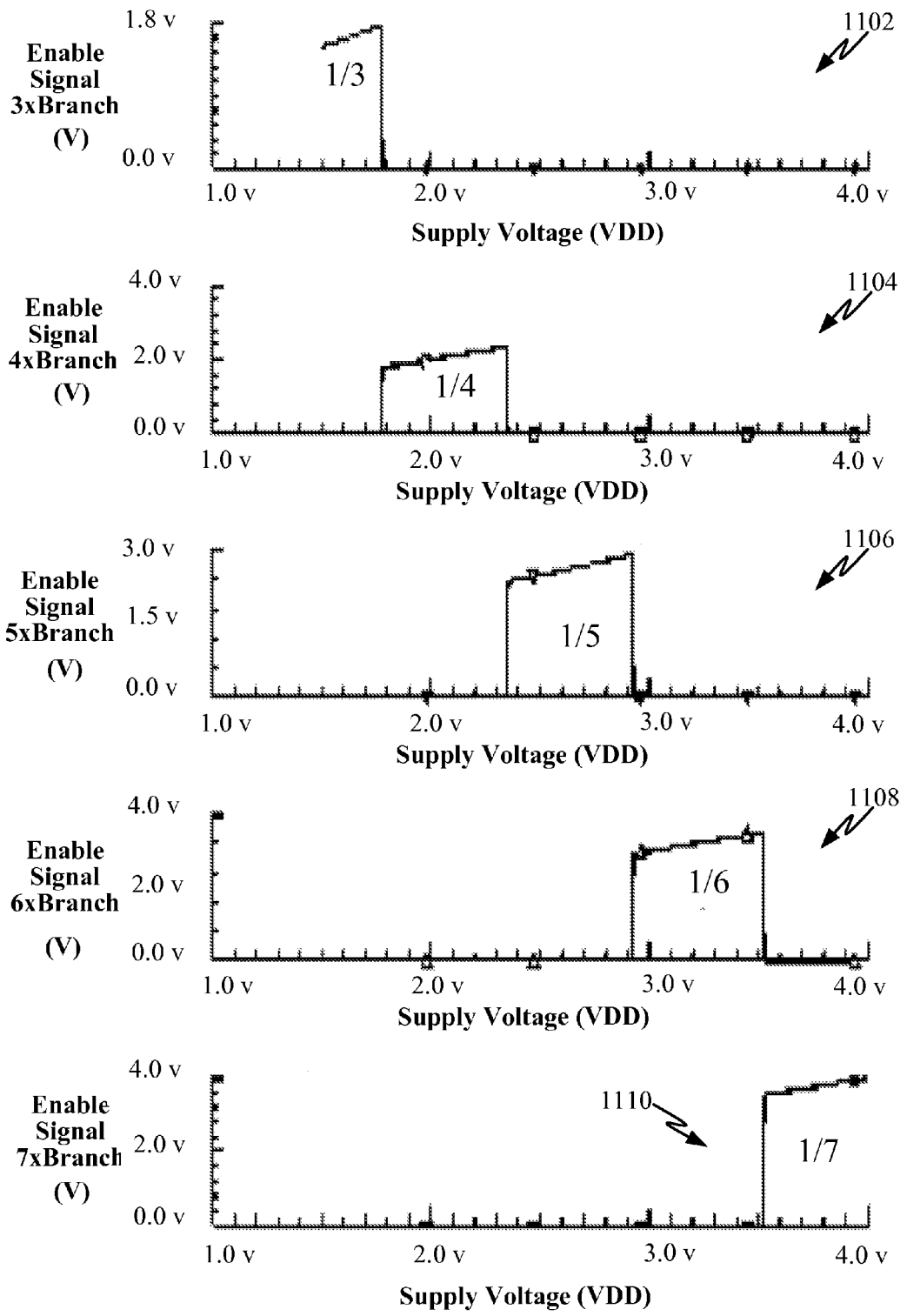
FIG. 11 illustrates how different divider branches are activated/deactivated to maintain a divided supply voltage within a range as a supply voltage changes.

FIG. 11 illustrates how different divider branches are activated/deactivated to maintain a divided supply voltage within a range as a supply voltage changes. Graphs 1102, 1104, 1106, 1108 and 1110 illustrate the operation of an enable signal (e.g., Enable_A, Enable_B, Enable_C, . . . , Enable_i in FIG. 2) for different divider branches as the supply voltage VDD changes. As can be appreciated, as the supply voltage VDD decreases from 4 volts to 1.5 volts, the voltage divider circuit automatically senses the voltage level and activates different divider branches, by use of an enable signal. The enable signal for each of a plurality of divider branches is illustrated in FIGS. 2-6.

Exemplary Voltage Divider Circuit

In one example, a voltage divider circuit is provided comprising a plurality of voltage divider branches and a control circuit coupled to the plurality of voltage divider branches. The plurality of voltage divider branches may have different divider factors to divide a supply voltage and obtain a divided supply voltage. The control circuit may be adapted to automatically monitor the supply voltage and dynamically select a voltage divider branch from among the plurality of voltage divider branches to maintain a selected divided supply voltage within a pre-determined voltage range. For instance, the selected divided supply voltage may correspond to the selected voltage divider branch.

The control circuit may dynamically and/or automatically select the voltage divider branch as the supply voltage changes (e.g., over time the supply voltage may decrease as it is depleted or increase as it is recharged). Each of the voltage divider branches may provide a different divided supply voltage and the selected divided supply voltage corresponds to the selected voltage divider branch. In one example, the control circuit may monitor the supply voltage indirectly by obtaining a voltage from one or more voltage divider branches and uses those voltages to ascertain when or if a new voltage divider branch should be selected and/or enabled and a current (i.e., presently selected) voltage divider branch should be deselected and/or disabled. For instance, the control circuit may operate to select a voltage divider branch to maintain the divided supply voltage within a pre-determined voltage range. That is, the divided supply voltage is taken from the selected voltage divider branch (e.g., enabled voltage divider chain). The control circuit may also operate to deactivate a previously-selected voltage divider branch when the voltage divider branch is selected. For instance, deactivating a previously-selected voltage divider branch may include deselecting a corresponding divider chain for the previously-selected voltage divider branch while maintaining a control chain enabled.

In one example, each voltage divider branch may include: (a) a divider chain that is coupled to the control circuit; and/or (b) a control chain coupled to the control circuit, wherein the control circuit activates and deactivates the divider chain based on a voltage sensed on the control chain. The divider chain may include a plurality of transistors coupled in series, with each voltage divider branch having a different number of transistors. The gate of each transistor may be coupled to the drain of that transistor, and the drain of a first transistor coupled to the source of the next transistor. The divided supply voltage may be obtained from the divider chain. For instance, the divided supply voltage may be obtained between the last and second to last transistor in each divider chain.

In one example, the control chain may include a plurality of transistors coupled in series, with each voltage divider branch having a different number of transistors. In another example, the control chain may include: (a) a resistive chain of transistors coupled in series, with the gate of each transistor in the resistive chain coupled to its drain; and/or (b) a monitoring chain having two transistors coupled in series, the gate of each of the first two transistors in the resistive chain coupled to the gate of a corresponding transistor in the monitoring chain. The resistive chain of transistors may have an equal number of transistors in series as the divider chain.

In one example, a plurality of voltage divider branches includes: (a) a first voltage divider branch having a first control chain and a first divider chain of a first divider factor, (b) a second voltage divider branch having a second control chain and a second divider chain of a second divider factor, where the second divider factor is greater than the first divider factor, and (c) a third voltage divider branch having a third control chain and a third divider of a third divider factor, where the third divider factor is greater than the second divider factor. When the second voltage divider branch is selected by the control circuit, the first divider chain and third divider chain are disabled and the second divider chain is enabled while the first, second, and third control chains are enabled. As illustrated in FIGS. 7A, 7B, and 7C, for a selected divider branch, the control chains of the next lowest divider branch is enabled along with all higher divider branches.

Figure 12:
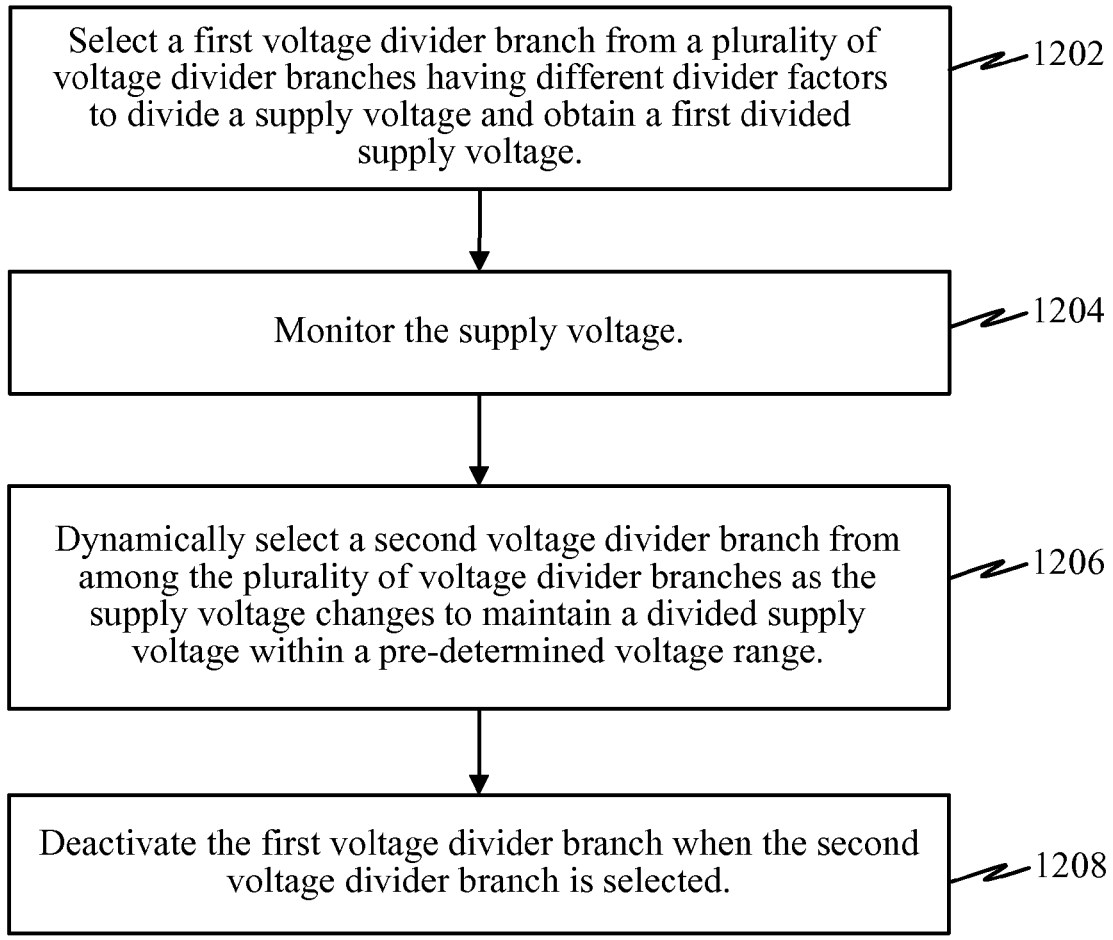
FIG. 12 illustrates a method to automatically and dynamically select a voltage divider branch.

FIG. 12 illustrates a method to automatically and dynamically select a voltage divider branch. A first voltage divider branch is selected from a plurality of voltage divider branches having different divider factors to divide a supply voltage VDD and obtain a divided supply voltage 1202. The supply voltage is then monitored 1204. As the supply voltage changes, a second voltage divider branch from among the plurality of voltage divider branches is dynamically selected to maintain the divided supply voltage within a pre-determined voltage range 1206.

The first voltage divider branch is deactivated when the second voltage divider branch is selected 1208. Deactivating the first voltage divider branch may include deselecting a corresponding divider chain for first voltage divider branch while maintaining a control chain enabled.

One or more of the components, steps, features and/or functions illustrated in the FIGURES may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the FIGURES may be configured to perform one or more of the methods, features, or steps described in the FIGURES. The novel algorithms described herein may also be efficiently implemented in software and/or embedded in hardware.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage medium may represent one or more devices for storing data, including read-only memory (ROM), random access memory (RAM), magnetic disk storage mediums, optical storage mediums, flash memory devices and/or other machine-readable mediums, processor-readable mediums, and/or computer-readable mediums for storing information. The terms "machine-readable medium", "computer-readable medium", and/or "processor-readable medium" may include, but are not limited to non-transitory mediums such as portable or fixed storage devices, optical storage devices, and various other mediums capable of storing, containing or carrying instruction(s) and/or data. Thus, the various methods described herein may be fully or partially implemented by instructions and/or data that may be stored in a "machine-readable medium", "computer-readable medium", and/or "processor-readable medium" and executed by one or more processors, machines and/or devices.

Furthermore, embodiments may be implemented by hardware, software, firmware, middleware, microcode, or any combination thereof. When implemented in software, firmware, middleware or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The various illustrative logical blocks, modules, circuits, elements, and/or components described in connection with the examples disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing components, e.g., a combination of a DSP and a microprocessor, a number of microprocessors, one or more microprocessors in conjunction with a DSP core, or any other such configuration.

The methods or algorithms described in connection with the examples disclosed herein may be embodied directly in hardware, in a software module executable by a processor, or in a combination of both, in the form of processing unit, programming instructions, or other directions, and may be contained in a single device or distributed across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing embodiments are merely examples and are not to be construed as limiting the invention. The description of the embodiments is intended to be illustrative, and not to limit the scope of the claims. As such, the present teachings can be readily applied to other types of apparatuses and many alternatives, modifications, and variations will be apparent to those skilled in the art.

What is claimed is:

1. A voltage divider circuit, comprising:
   a plurality of voltage divider branches having different divider factors to divide a supply voltage and obtain a divided supply voltage; and
   a control circuit coupled to the plurality of voltage divider branches, the control circuit adapted to automatically monitor the supply voltage and dynamically select a voltage divider branch from among the plurality of voltage divider branches to maintain a selected divided supply voltage within a pre-determined voltage range.

2. The voltage divider circuit of claim 1, wherein the control circuit dynamically and automatically selects the voltage divider branch as the supply voltage changes.

3. The voltage divider circuit of claim 1, wherein each of the voltage divider branches provides a different divided supply voltage and the selected divided supply voltage corresponds to the selected voltage divider branch.

4. The voltage divider circuit of claim 1, wherein the control circuit operates to deactivate a previously-selected voltage divider branch when the voltage divider branch is selected.

5. The voltage divider circuit of claim 4, wherein deactivating a previously-selected voltage divider branch includes deselecting a corresponding divider chain for the previously-selected voltage divider branch while maintaining a control chain enabled.

6. The voltage divider circuit of claim 1, wherein each voltage divider branch includes:
   a divider chain that is coupled to the control circuit; and
   a control chain coupled to the control circuit, wherein the control circuit activates and deactivates the divider chain based on a voltage sensed on the control chain.

7. The voltage divider circuit of claim 6, wherein the divided supply voltage is obtained from the divider chain.

8. The voltage divider circuit of claim 6, wherein a plurality of voltage divider branches includes
   a first voltage divider branch having a first control chain and a first divider chain of a first divider factor;
   a second voltage divider branch having a second control chain and a second divider chain of a second divider factor, where the second divider factor is greater than the first divider factor;
   a third voltage divider branch having a third control chain and a third divider of a third divider factor, where the third divider factor is greater than the second divider factor;
   wherein when the second voltage divider branch is selected by the control circuit the first divider chain and third divider chain are disabled and the second divider chain is enabled while the first, second, and third control chains are enabled.

9. The voltage divider circuit of claim 6, wherein the divider chain includes a plurality of transistors coupled in series, with each voltage divider branch having a divider chain with a different number of transistors.

10. The voltage divider circuit of claim 9, wherein the gate of each transistor in the divider chain is coupled to the drain of that transistor, and the drain of a first transistor in the divider chain is coupled to the source of a next transistor in the divider chain.

11. The voltage divider circuit of claim 6, wherein the control chain includes a plurality of transistors coupled in series, with each voltage divider branch having a different number of transistors.

12. The voltage divider circuit of claim 6, wherein the control chain includes
   a resistive chain of transistors coupled in series, with the gate of each transistor coupled to its drain; and
   a monitoring chain having two transistors coupled in series, the gate of each of the first two transistors in the resistive chain coupled to the gate of a corresponding transistor in the monitoring chain.

13. The voltage divider circuit of claim 12, wherein the resistive chain of transistors has an equal number of transistors in series as the divider chain.

14. A method of operating a voltage divider circuit, comprising:
   selecting a first voltage divider branch from a plurality of voltage divider branches having different divider factors to divide a supply voltage and obtain a divided supply voltage;
   monitoring the supply voltage; and
   dynamically selecting a second voltage divider branch from among the plurality of voltage divider branches as the supply voltage changes to maintain the divided supply voltage within a pre-determined voltage range.

15. The method of claim 14, further comprising:
   deactivating the first voltage divider branch when the second voltage divider branch is selected.

16. The method of claim 15, wherein deactivating the first voltage divider branch includes deselecting a corresponding divider chain for first voltage divider branch while maintaining a control chain enabled.

17. The method of claim 14, wherein each of the plurality of voltage divider branches include:
   a divider chain; and
   a control chain that causes the divider chain to be activated or deactivated based on a voltage sensed on the control chain.

18. The method of claim 17, wherein the divided supply voltage is obtained from the divider chain.

19. The method of claim 17, wherein a plurality of voltage divider branches includes
   the first voltage divider branch having a first control chain and a first divider chain of a first divider factor;
   the second voltage divider branch having a second control chain and a second divider chain of a second divider factor, where the second divider factor is greater than the first divider factor;

a third voltage divider branch having a third control chain and a third divider of a third divider factor, where the third divider factor is greater than the second divider factor;

wherein when the second voltage divider branch is selected by the control circuit the first divider chain and third divider chain are disabled and the second divider chain is enabled while the first, second, and third control chains are enabled.

20. The method of claim 17, wherein the divider chain includes a plurality of transistors coupled in series, with each voltage divider branch having a divider chain with a different number of transistors.

21. The method of claim 20, wherein the gate of each transistor in the divider chain is coupled to the drain of that transistor, and the drain of a first transistor in the divider chain is coupled to the source of a next transistor in the divider chain.

22. The method of claim 17, wherein the control chain includes a plurality of transistors coupled in series, with each voltage divider branch having a different number of transistors.

23. The method of claim 17, wherein the control chain includes
   a resistive chain of transistors coupled in series, with the gate of each transistor in the resistive chain coupled to its drain; and
   a monitoring chain having two transistors coupled in series, the gate of each of the first two transistors in the resistive chain coupled to the gate of a corresponding transistor in the monitoring chain.

24. The method of claim 23, wherein the resistive chain of transistors has an equal number of transistors in series as the resistor chain.

25. A voltage divider circuit, comprising:
   means for selecting a first voltage divider branch from a plurality of voltage divider branches having different divider factors to divide a supply voltage and obtain a divided supply voltage; and
   means for monitoring the divided supply voltage; and
   means for dynamically selecting a second voltage divider branch from among the plurality of voltage divider branches as the supply voltage changes to maintain the divided supply voltage within a pre-determined voltage range.

26. The voltage divider circuit of claim 25, further comprising:
   means for deactivating the first voltage divider branch when the second voltage divider branch is selected.

27. The voltage divider circuit of claim 26, wherein deactivating the first voltage divider branch includes deselecting a corresponding divider chain for first voltage divider branch while maintaining a control chain enabled.

28. The voltage divider circuit of claim 25, wherein each of the voltage divider branches provides a different divided supply voltage and the selected divided supply voltage corresponds to the selected voltage divider branch.

* * * * *